(12) United States Patent
Parkhurst et al.

(10) Patent No.: US 7,009,450 B2
(45) Date of Patent: Mar. 7, 2006

(54) LOW DISTORTION AND HIGH SLEW RATE OUTPUT STAGE FOR VOLTAGE FEEDBACK AMPLIFIER

(75) Inventors: Charles Parkhurst, Allen, TX (US); Muhammad Islam, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 4 days.

(21) Appl. No.: 10/733,022

(22) Filed: Dec. 11, 2003

(65) Prior Publication Data

US 2005/0127999 A1    Jun. 16, 2005

(51) Int. Cl.
*H03F 3/26* (2006.01)
(52) U.S. Cl. .................................... 330/255; 330/267
(58) Field of Classification Search ............... 330/252, 330/255, 261, 263, 267
See application file for complete search history.

(56) References Cited

U.S. PATENT DOCUMENTS 5,789,982 A * 8/1998 Uscategui et al. .......... 330/255
5,798,673 A * 8/1998 Griffith et al. .............. 330/255

* cited by examiner

*Primary Examiner*—Steven J. Mottola
(74) *Attorney, Agent, or Firm*—W. Daniel Swayze, Jr.; W. James Brady; Frederick J. Telecky, Jr.

(57) ABSTRACT

A voltage feedback ("VF") operational amplifier ("op-amp") that includes a circuit operable to dynamically bias pre-driver transistors at the op amp output stage. This arrangement provides a dynamic bias from a common base gain stage (302) to the pre-drivers (338, 339) of the output stage (303) so that higher slew rate is achieved with minimal discontinuity in the signal.

17 Claims, 4 Drawing Sheets

LOW DISTORTION AND HIGH SLEW RATE OUTPUT STAGE FOR VOLTAGE FEEDBACK AMPLIFIER

TECHNICAL FIELD

The present invention relates to voltage feedback ("VF") operational amplifier ("op amp") circuits, specifically circuits configured as high speed, full bandwidth operational amplifiers.

BACKGROUND OF THE INVENTION

The VF op amp is one of the most common types of op amps. High speed VF op amps are used in a variety of circuits, including arbitrary waveform generators, high linearity analog to digital converters ("ADC"), preamplifiers, digital to analog converters ("DAC"), output buffers, active filters and wireless communication receivers. In a typical VF op amp, there are two inputs, a positive input and a negative input, and one output. Across the two inputs, an error voltage (Ve) is developed. The output voltage (Vo) of the op amp is obtained by multiplying "a" by Ve, where "a" is the open loop voltage gain of the op amp. When negative feedback is applied from the output of the op amp across a resistor divider network, for example R1 and R2, to the negative input, the action of the op amp is to drive Ve to zero. This topology defines the VF op amp. Voltage feedback reduces the gain and stabilizes the VF op amp. In this situation, gain can be set by the ratio of R1 to R2. However, the gain of the VF op amp is frequency dependent. It is well known that the closed loop gain and closed loop bandwidth remain substantially constant over most of the frequencies of operation. Thus, if gain is increased, bandwidth is reduced and vice versa. As used herein, the term fast refers to the ability of the op amp to accurately reproduce high and extremely high frequency signals.

A conventional class AB op amp circuit 100 is seen in FIG. 1. This op amp circuit 100 comprises an input stage 101 with a common base gain stage 102 and a classic diamond driver 103, comprised of transistors Q22 22, Q23 23, Q24 24, and Q25 25. The front end of op amp circuit 100 comprised of input stage 101 and gain stage 102 contribute to a fast op amp configuration. Input stage 101 is fast due to the fact that the current coming out of transistors Q11 11, Q33 33, Q99 99 and Q10 10 change exponentially with the error voltage Ve. If the signal is increased then more error voltage is developed and as a consequence more current is delivered from input stage 101. Gain stage 102 is fast because it is driven by the exponential currents from input stage 101. These exponential currents increase or decrease the base to emitter voltage ($V_{BE}$) on transistors Q13 13 and Q15 15. This voltage becomes a current that changes exponentially with $V_{BE}$. Output stage 103 of op amp circuit 100 is a limiting factor in terms of speed of the overall circuit because when the signal being fed therein is too fast, the current from static current sources comprised of transistors Q48 48 and Q50 50 feeding the pre-drivers, comprising transistors Q22 22, and Q23 23, decreases due to parasitic capacitance ($C_{BC}$ and $C_{BE}$) associated with transistor Q48 48 and transistor Q50 50. Less current reduces the speed of these transistors. In other words, these transistors react slower to a signal when it has less current through them. The parasitic capacitance $C_{BC}$ or $C_\mu$ is a capacitance caused by the depletion region in a reverse biased PN junction. The parasitic capacitance $C_{BE}$ or $C_\pi$ is a capacitance caused by the depletion region in forward biased PN junction. What is desired is a high speed VF op amp with a high slew rate adapted to provide full power bandwidth and lower distortion at higher frequencies. Full power bandwidth indicates how fast an amplifier is able to perform. It is a different way of measuring slew rate which is a measurement of the speed of the amplifier.

SUMMARY OF THE INVENTION

The present invention achieves technical advantages as an op amp circuit operable to provide a dynamic bias from a common base gain stage to pre-drivers of an output stage. This arrangement allows the op amp to achieve a higher slew rate without any discontinuity in the signal and without an increase in power dissipation. Numerous advantages are provided by the invention, including but not limited to, the ability to achieve full power bandwidth and lower distortion at higher frequencies and/or higher signal amplitudes. These and other advantages related to the invention will become apparent to persons skilled in the relevant arts through careful reading of the disclosure and claims presented herein.

BRIEF DESCRIPTION OF THE DRAWINGS

For a better understanding of the invention including its features, advantages and specific embodiments, reference is made to the following detailed description along with accompanying drawings in which.

Figure 1:
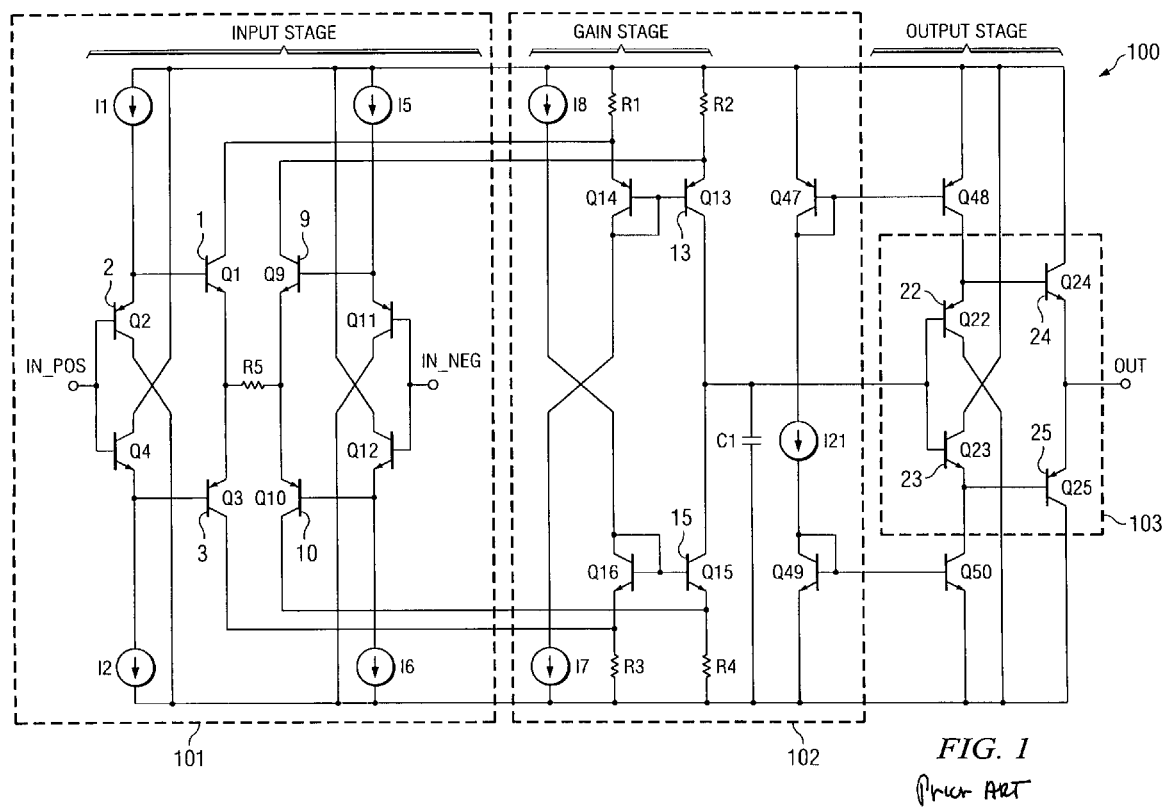
FIG. 1 illustrates a conventional op amp used to increase full power bandwidth.

References in the detailed description correspond to like references in the figures unless otherwise noted. Descriptive and directional terms such as top, bottom, left, right, first, second, refer to the drawing itself as laid out on the paper and not to physical limitations of the invention unless specifically noted.

DETAILED DESCRIPTION OF A PREFERRED EMBODIMENT

While a single configuration of the present invention is discussed in detail below, it should be appreciated that the present invention provides many applicable inventive concepts which can be embodied in a wide variety of specific contexts.

FIG. 1 illustrates a conventional op amp circuit 100. As seen therein, it includes an input stage 101 with a single gain stage 102 and a unity gain output stage 103. To achieve the highest full power bandwidth, the gain stage 102 is typically based on a common base architecture so that the secondary poles are at very high frequencies.

Output stage 103, is a diamond driver comprised of transistors Q22 22, Q23 23, Q24 24, and Q25 25. The circuit of FIG. 1 is inherently fast, however, when the signal being fed therein is too fast, the current from the static current sources comprised of transistors Q48 48 and Q50 50 feeding the pre-drivers comprised of transistors Q22 22 and Q23 23 will decrease the speed of the op amp circuit due to the parasitic capacitance $C_{BC}$ and $C_{BE}$ associated with transistors Q48 48 and Q50 50.

Figure 2:
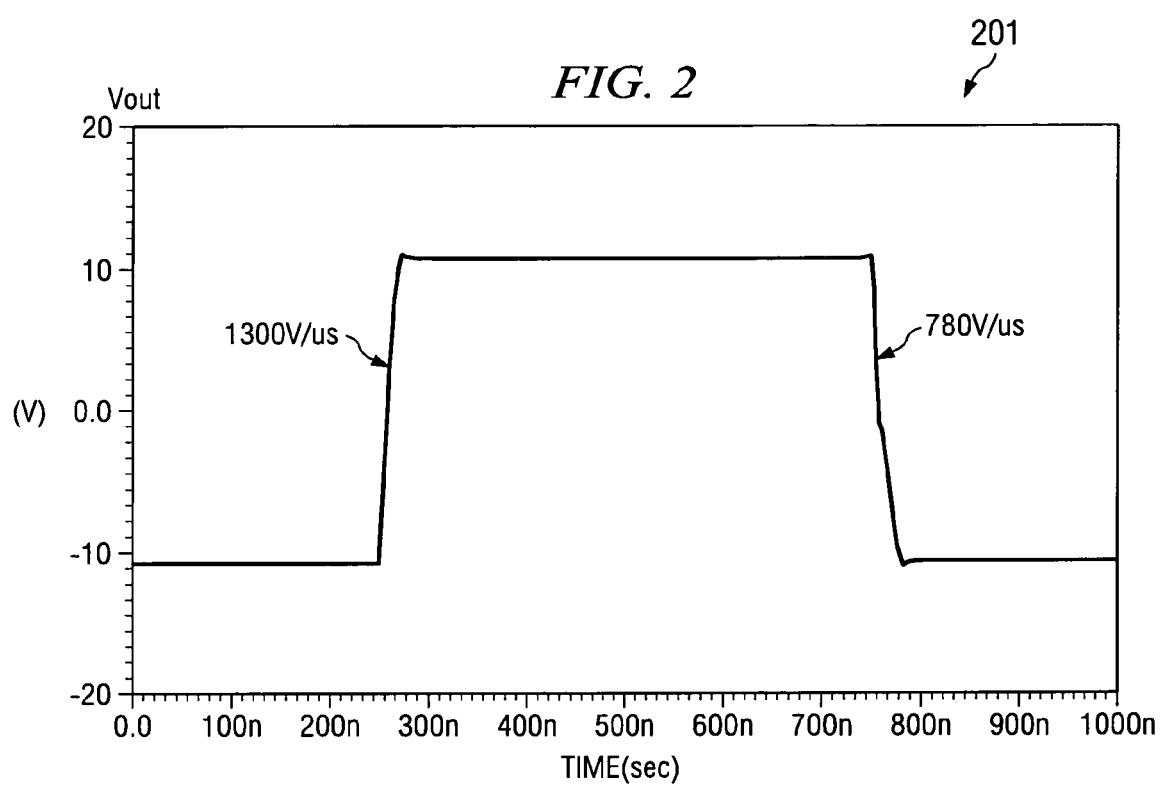
FIG. 2 is a step response plot at the output of the op amp of FIG. 1.

FIG. 2 is a plot 201 illustrating the step response at the output of the conventional op amp circuit 100 of FIG. 1. From the plot 201 of FIG. 2, it can be noted that the pulse has a limited slew rate. It also shows a discontinuity when the signal is transitioning from one level to another. This discontinuity contributes to the decrease in the slew rate. In order to overcome these disadvantages, a circuit arrangement is desired that provides a dynamic bias from the common base gain stage 102 to the pre-drivers of the output stage 103 so that a higher slew rate is achieved without any discontinuity.

Figure 3:
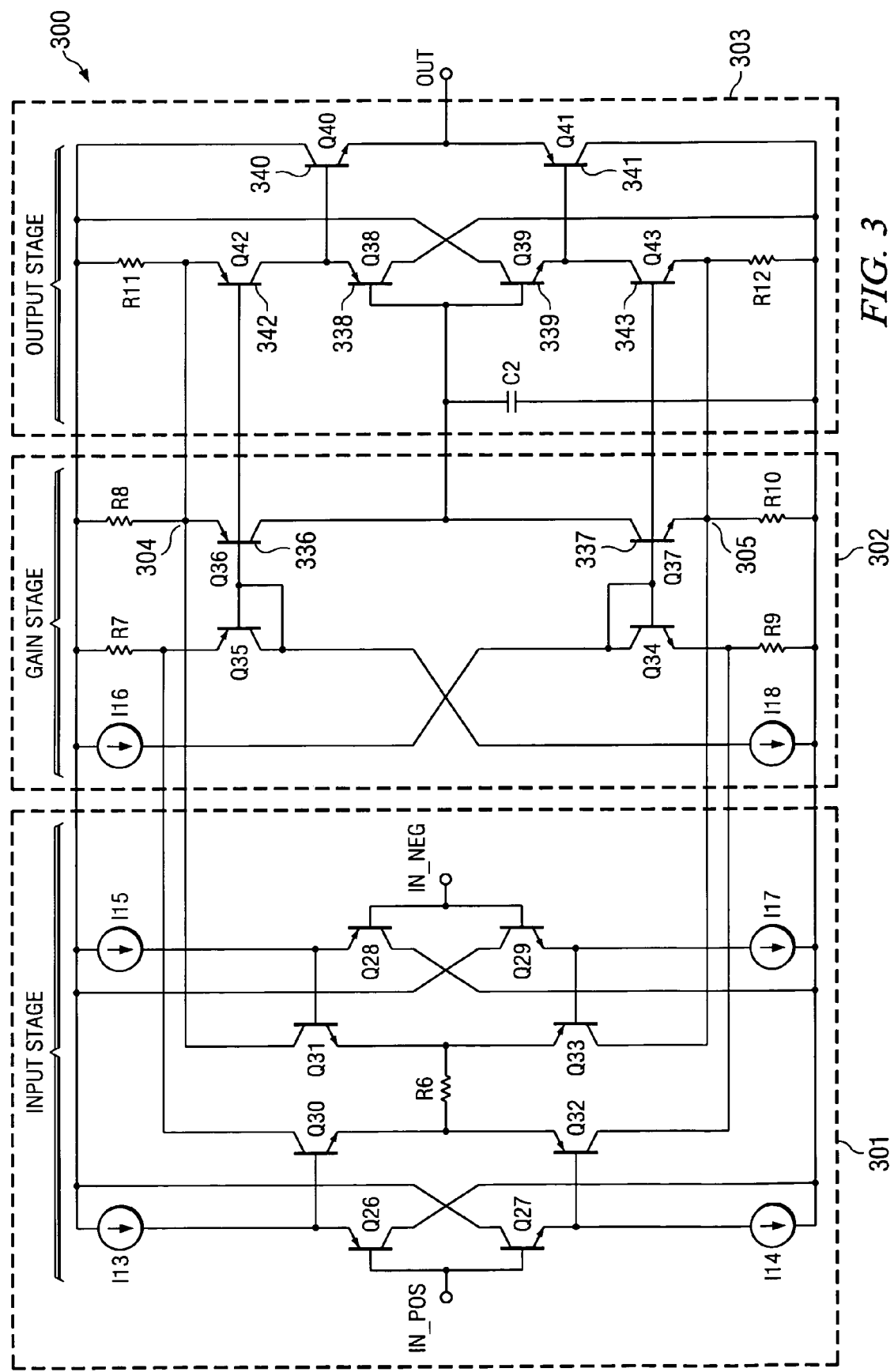
FIG. 3 depicts the operational amplifier of the present invention showing the dynamic bias configuration at the output stage.

FIG. 3 depicts an embodiment of an op amp circuit 300 of the present invention. This op amp is configured as a class AB op amp. In contrast to the conventional circuit of FIG. 1, op amp circuit 300 of the present invention utilizes a dynamic bias at output stage 303 provided by transistor Q38 338, Q39 339, Q40 340 and Q41 341. Transistors Q38 338 and Q39 339 are driven by current from transistors Q36 336 and Q37 337. As seen therein, the emitters of transistor Q42 342 and transistor Q43 343 are coupled such that they will copy the source current or sink current at high impedance nodes 304 and 305 at the collectors of Q36 336 and Q37 337 from gain stage 302. Further, as seen therein, transistor Q36 336 and transistor Q37 337, are used to create the high impedance nodes at gain stage 302. Transistors Q42 342, Q43 343, Q36 336 and Q37 337 share the same base-emitter connections. These connections ensure that the current from transistors Q36 336 and Q42 342 are the same, and the current from transistors Q37 337 and Q43 343 are the same.

Figure 4:
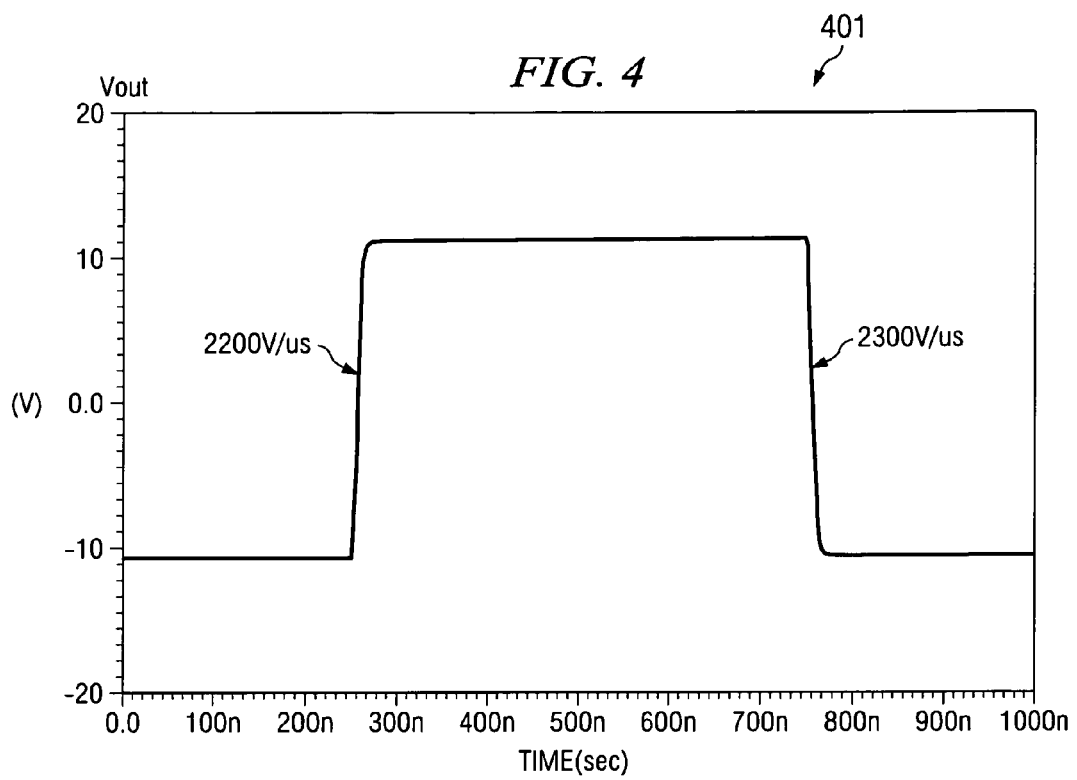
FIG. 4 is a pulse response plot of the operational amplifier of the present invention.

FIG. 4 shows a plot 401 of the pulse response of the op amp circuit 300 of FIG. 3. As can be seen therein, the op amp circuit 300 of the present invention has higher slew rate than the conventional op amp circuit 100 of FIG. 1, as seen in the plot of FIG. 2.

Figure 5:
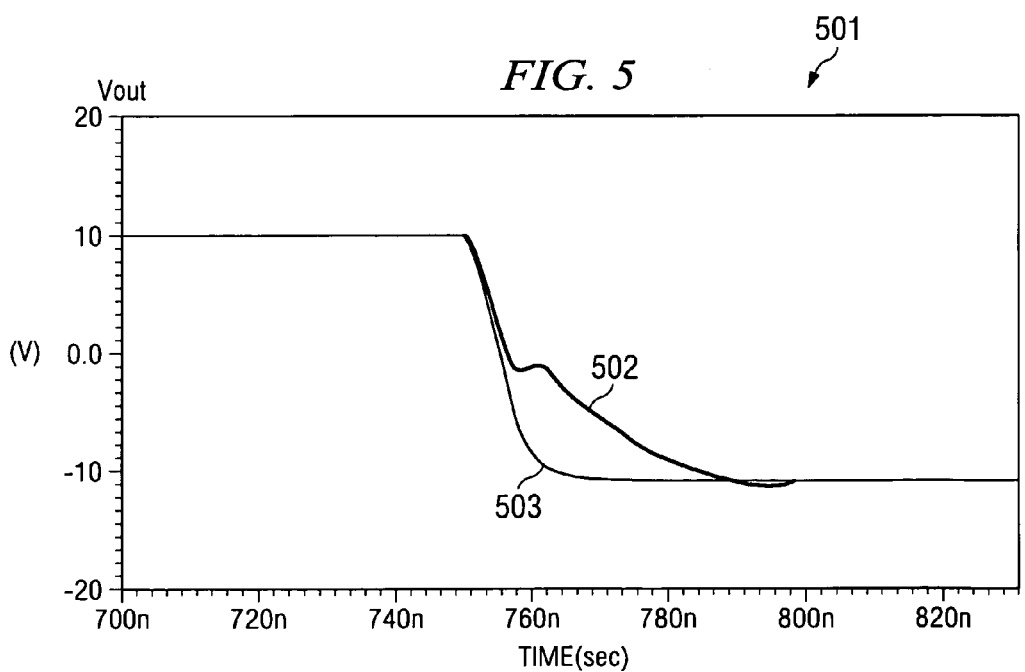
FIG. 5 is a composite plot of the falling edge of the pulse response of the conventional operational amplifier and the operational amplifier of the present invention.

FIG. 5 is a composite plot 501 of the falling edge of the pulse response for the conventional op amp circuit 100 and the op amp circuit 300 of the present invention. Plot 503 illustrates the improvement in speed of the op amp circuit 300 over the conventional op amp circuit 100 of FIG. 1. The improvement in the slew rate also contributes to the better linearity of the present invention over the conventional op amp circuit 100. The lower distortion of the circuit of the present invention is obtainable because the $V_{BE}$ junction of the pre-drivers, comprised of transistors Q38 338 and Q39 339, varies minimally during signal transitions. This results in minimization of the non-linear capacitance and thus less distortion in the output response. The advantages of this biasing scheme include less distortion and higher slew rate without an increase in power consumption.

The embodiment shown and described above is only exemplary. Even though several characteristics and advantages of the present invention have been set forth in the foregoing description together with details of the method of the invention, the disclosure is illustrative only and changes may be made within the principles of the invention to the full extent indicated by the broad general meaning of the terms used in the attached claims. Reference to specific npn and pnp transistors herein or in the Figures is not meant to be limiting as these transistor types can be switched depending on the polarity of the applied signals.

What is claimed is:

1. A circuit for dynamically biasing an output stage of an op amp having a gain stage, comprising:

a first transistor (Q38), a second transistor (Q39), a third transistor (Q40), a fourth transistor (Q41), a fifth transistor (Q36), and a sixth transistor (Q37);

the first transistor (Q38) responsively coupled to and driven by current from the fifth transistor (Q36);

the second transistor (Q39) responsively coupled to and driven by current from the sixth transistor (Q37);

a seventh transistor (Q42) having a collector coupled to an emitter of the first transistor (Q38) and a base of the third transistor (Q40), and an emitter coupled to a first high impedance node operable to source current from the gain stage; and an eighth transistor (Q43) having a collector coupled to an emitter of the second transistor (Q39) and a base of the fourth transistor (Q41), and an emitter coupled to a second high impedance node operable to sink current from the gain stage.

2. The circuit of claim 1, further comprising the fifth transistor (Q36), sixth transistor (Q37), seventh transistor (Q42) and eighth transistor (Q43) sharing the same base-emitter connections;

the coupling of the fifth transistor (Q36), the sixth transistor (Q37), the seventh transistor (Q42) and the eighth transistor (Q43) being operable to force current from the fifth transistor (Q36) and the seventh transistor (Q42) to substantially match, and current from the sixth transistor (Q37) and the eighth transistor (Q43) to substantially match.

3. The circuit of claim 1, wherein the first transistor (Q38), the second transistor (Q39), the third transistor (Q40), the fourth transistor (Q41), the fifth transistor (Q36), the sixth transistor (Q37), the seventh transistor (Q42) and the eighth transistor (Q43) comprise bipolar transistors.

4. The circuit of claim 3, wherein the first transistor (Q38), the fourth transistor (Q41), the fifth transistor (Q36) and the seventh transistor (Q42) comprise pnp type transistors; and the second transistor (Q39), the third transistor (Q40), the sixth transistor (Q37), and the eighth transistor (Q43) comprise npn transistors.

5. The circuit of claim 1, wherein the output stage forms a portion of class AB operational amplifier.

6. The circuit of claim 5, wherein the circuit forms a portion of the op amp voltage feedback.

7. The circuit of claim 5, adapted for use in an arbitrary waveform generator.

8. The circuit of claim 5, adapted for use in a high linearity analog to digital converter ("ADC").

9. The circuit for dynamically biasing the output stage of an op amp of claim 5, adapted as a digital to analog converter ("DAC") circuit.

10. The circuit of claim 5, adapted for use in an output buffer circuit.

11. The circuit of claim 5, adapted for use in an active filter circuit.

12. The circuit of claim 5, adapted for use in a wireless communication receiver circuit.

13. An op amp circuit stage, comprising:

an input stage having at least one input and at least one output:

a common base gain stage having at least one input, and at least one output coupled to the output of the input stage;

an output stage including a pre-driver circuit coupled to the output of the common base gain stage; and a dynamic biasing circuit operable to provide dynamic bias from the common base gain stage to the pre-driver circuit of the output stage, wherein the dynamic biasing circuit further comprises:
a first transistor (Q38), a second transistor (Q39), a third transistor (Q40), a fourth transistor (Q41), a fifth transistor (Q36), and a sixth transistor (Q37);
the first transistor (Q38) being responsively coupled to and driven by current from the fifth transistor (Q36);
the second transistor (Q39) being responsively coupled and driven by current from the sixth transistor (Q37);
a seventh transistor (Q42) having a collector being coupled to an emitter of the first transistor (Q38) and a base of the third transistor (Q40), having an emitter being coupled to a first high impedance node operable to source current from the gain stage; and
an eighth transistor (Q43) having a collector being coupled to an emitter of the second transistor (Q39) and a base of the fourth transistor (Q41), and an emitter being coupled to a second high impedance node operable to sink current from the common base gain stage.

14. The op amp circuit of claim 13, wherein the dynamic biasing circuit is operable to copy current from at least one node at the common base gain stage into the output stage to achieve high linearity.

15. A circuit for biasing pre-drivers of an op-amp output stage, comprising:
a first transistor (038), a second transistor (Q39), a third transistor (Q40) and a fourth transistor (Q41), a first current source and a second current source;
an emitter of the first transistor (038) being coupled to a base of the third transistor (Q40);
an emitter of the second transistor (Q39) being coupled to a base of the fourth transistor (Q41);
a base of the first transistor (Q38) being responsively coupled to and dynamically driven by current from the first current source; and
a base of the second transistor (Q39) being responsively coupled and dynamically driven by current from the second current source,
the first current source comprising a fifth transistor (Q36);
the second current source comprising a sixth transistor (Q37);
a seventh transistor (Q42) having a collector coupled to an emitter of the first transistor (Q38) and a base of the third transistor (Q40), and an emitter being coupled to a first high impedance node operable to source current from a gain stage of the op amp;
an eighth transistor (Q43) having a collector coupled to an emitter of the second transistor (Q39) and a base of the fourth transistor (Q41), and an emitter being coupled to a second high impedance node operable to sink current from the gain stage;
the fifth transistor (Q36), sixth transistor (Q37), seventh transistor (Q42) and eighth transistor (Q43) sharing the same base-emitter connections; and
the fifth transistor (Q36), sixth transistor (Q37), seventh transistor (Q42) and eighth transistor (Q43) being operably coupled to force current from the fifth transistor (Q36) and the seventh transistor (Q42) to substantially match current from the sixth transistor (Q37) and the eighth transistor (Q43) to substantially match, respectively.

16. The circuit of claim 15, further comprising a node capacitively coupling the bases of the first transistor (Q38) and second transistor (Q39) to a voltage rail.

17. The circuit of claim 15, wherein the first transistor (Q38), fourth transistor (Q41), fifth transistor (Q36) and seventh transistor (Q42) further comprise pnp-type transistors; and
the second transistor (Q39), third transistor (Q40), sixth transistor (Q37), and eighth transistor (Q43) further comprise npn-type transistors.

* * * * *